(12) United States Patent
Ivanvov

(10) Patent No.: US 6,423,196 B1
(45) Date of Patent: Jul. 23, 2002

(54) METHOD OF MAKING NI-SI MAGNETRON SPUTTERING TARGETS AND TARGETS MADE THEREBY

(75) Inventor: Eugene Y. Ivanvov, Grove City, OH (US)

(73) Assignee: Tosoh SMD, Inc., Grove City, OH (US)

(*) Notice: Subject to any disclaimer, the term of this patent is extended or adjusted under 35 U.S.C. 154(b) by 0 days.

(21) Appl. No.: 09/509,360
(22) PCT Filed: Nov. 19, 1998
(86) PCT No.: PCT/US98/24983
§ 371 (c)(1), (2), (4) Date: Mar. 24, 2000
(87) PCT Pub. No.: WO99/25892
PCT Pub. Date: May 27, 1999

Related U.S. Application Data
(60) Provisional application No. 60/066,185, filed on Nov. 19, 1997.

(51) Int. Cl.⁷ .............. C23C 14/34; B22F 3/00; C22C 19/03
(52) U.S. Cl. .............. 204/298.13; 204/192.12; 204/192.2; 204/192.23; 419/66; 419/69; 75/230; 75/245; 420/441; 420/578
(58) Field of Search .............. 204/192.12, 192.2, 204/192.23, 299.13; 419/66, 69; 75/230, 245; 29/527.5, 527.6, 527.7; 428/621, 655; 164/47, 459, 460

(56) References Cited

U.S. PATENT DOCUMENTS

| | | | |
|---|---|---|---|
| 4,094,761 A | 6/1978 | Wilson | 204/192.2 |
| 4,299,678 A | 11/1981 | Meckel | 204/192.2 |
| 4,505,798 A | 3/1985 | Ramachandran et al. | 204/298.09 |
| 4,622,122 A | 11/1986 | Landau | 204/298.19 |
| 4,990,234 A | 2/1991 | Szczybowski et al. | 204/192.23 |
| 4,992,095 A | 2/1991 | Nate et al. | 75/246 |
| 5,294,321 A | 3/1994 | Satou et al. | 204/298.13 |
| 5,407,551 A | 4/1995 | Sieck et al. | 204/298.19 |
| 5,409,517 A | 4/1995 | Satou et al. | 75/228 |
| 5,415,754 A | 5/1995 | Manley | 204/192.12 |
| 5,418,071 A | 5/1995 | Satou et al. | 428/552 |
| 5,464,520 A | 11/1995 | Kano et al. | 204/298.13 |
| 5,612,571 A | 3/1997 | Satou et al. | 257/757 |
| 5,618,397 A | 4/1997 | Kano et al. | 204/298.13 |
| 6,274,244 B1 * | 8/2001 | Finley et al. | 428/433 |

FOREIGN PATENT DOCUMENTS

JP 8067972 3/1996

* cited by examiner

Primary Examiner—Rodney G. McDonald
(74) Attorney, Agent, or Firm—Biebel & French

(57) ABSTRACT

A method for making a nickel/silicon sputter target, targets made thereby and sputtering processes using such targets. The method includes the step of blending molten nickel with sufficient molten silicon so that the blend may be cast to form an alloy containing no less than 4.5 wt .% silicon. Preferably, the cast ingot is then shaped by rolling it to form a plate having a desired thickness. Sputter targets so formed are capable of use in a conventional magnetron sputter process; that is, one can be positioned near a cathode in the presence of an electric potential difference and a magnetic field so as to induce sputtering of nickel ion form the sputter target onto the substrate.

10 Claims, 3 Drawing Sheets

METHOD OF MAKING NI-SI MAGNETRON SPUTTERING TARGETS AND TARGETS MADE THEREBY

This application claims the benefit of provisional application 60/066,185 filed Nov. 19, 1997.

FIELD OF THE INVENTION

The present invention relates to methods for making sputter targets for magnetron sputtering, sputter targets made by the methods, and methods of sputtering using such targets. More particularly, the invention relates to the manufacture of sputter targets using nickel-silicon alloys and to targets manufactured thereby.

BACKGROUND OF THE INVENTION

Cathodic sputtering is widely used for depositing thin layers or films of materials from sputter targets onto desired substrates such as semiconductor wafers. Basically, a cathode assembly including a sputter target is placed together with an anode in a chamber filled with an inert gas, preferably argon. The desired substrate is positioned in the chamber near the anode with a receiving surface oriented normally to a path between the cathode assembly and the anode. A high voltage electric field is applied across the cathode assembly and the anode.

Electrons ejected from the cathode assembly ionize the inert gas. The electrical field then propels positively charged ions of the inert gas against a sputtering surface of the sputter target. Material dislodged from the sputter target by the ion bombardment traverses the chamber and deposits on the receiving surface of the substrate to form the thin layer or film.

In so-called magnetron sputtering, one or more magnets are positioned behind the cathode assembly to generate a magnetic field. Magnetic fields generally can be represented as a series of flux lines, with the density of such flux lines passing through a given area, referred to as the "magnetic flux density," corresponding to the strength of the field. In a magnetron sputtering apparatus, the magnets form arch-shaped flux lines which penetrate the target and serve to trap electrons in annular regions adjacent the sputtering surface. The increased concentrations of electrons in the annular regions adjacent the sputtering surface promote the ionization of the inert gas in those regions and increase the frequency with which the gas ions strike the sputtering surface beneath those regions.

Nickel is commonly used in physical vapor deposition ("PVD") processes for forming nickel silicide films by means of the reaction of deposited nickel with a silicon substrate. Yet, while magnetron sputtering methods have improved the efficiency of sputtering many target materials, such methods are less effective in sputtering "ferromagnetic" metals such as nickel. It has proven difficult to generate a sufficiently strong magnetic field to penetrate a nickel sputter target to efficiently trap electrons in the annular regions adjacent the sputtering surface of the target.

In order to provide a background for the present invention, certain aspects of the magnetic behavior of metals will be briefly described.

The magnetic flux density vector within a metal body generally differs from the magnetic flux density external to the body. Typically, the component "B" of the magnetic flux density along a given direction in space within a metal body may be expressed in accordance with the relationship $B=\mu_0$ (H+M), where "$\mu_0$" is a constant referred to as the magnetic permeability of empty space; "H" is the corresponding component of the so-called "magnetic field intensity" vector; and "M" is the corresponding component of the so-called "magnetization" vector. (Note that positive and negative values of the components of the magnetic flux density, the magnetic field intensity and the magnetization represent opposite directions in space, respectively.)

The magnetic field intensity may be thought of as the contribution to the internal magnetic flux density due to the penetration of the external magnetic field into the metallic body. The magnetization may be thought of as the contribution to the internal magnetic flux density due to the alignment of magnetic fields generated primarily by the electrons within the metal.

In "paramagnetic" materials, the magnetic fields generated within the metal tend to align so as to increase the magnetic flux density within the metal. Furthermore, the magnetic fields generated within a paramagnetic metal do not strongly interact and cannot stabilize the alignment of the magnetic fields generated within the metal, so that the paramagnetic metal is incapable of sustaining any residual magnetic field once the external magnetic field is removed. Thus, for many paramagnetic metals and at a constant temperature, the "magnetization curve," which relates the magnetic flux density to the magnetic field strength within the metal, is linear and independent of the manner in which the external magnetic field is applied.

In a "ferromagnetic" metal such as nickel, the magnetic fields generated within the metal do interact sufficiently for the metal to retain a residual magnetic field when the external field is removed. Below a "Curie temperature" characteristic of a ferromagnetic metal, the metal must be placed in an external magnetic field directed oppositely to the residual field in the metal in order to dissipate the residual field.

At any constant temperature below the Curie temperature, the relationship between the magnetic flux density and the magnetic field intensity in the metal differs depending on how the external magnetic field has varied over time. For example, if a ferromagnetic metal is magnetized to its maximum, or "saturation," flux density in one direction in space and then the external magnetic field is slowly reversed to the opposite direction, the magnetic flux density within the metal will decrease as a function of the magnetic field intensity along a first path until the magnetic flux within the metal reaches the negative of the saturation value. If the external field is again reversed so as to remagnetize the metal in the original direction, the magnetic flux density within the metal will increase as a function of the magnetic field intensity along a second path which differs from the first path in relation to the reversal of the residual magnetic field. The shape of the resulting dual-path magnetization curve, which is referred to as a "hysteresis loop," is characteristic of ferromagnetic behavior.

When a ferromagnetic metal is surrounded by a gas in the presence of a magnetic field, the ferromagnetic metal tends to "attract" the flux lines of the magnetic field away from the surrounding gas into itself. This prevents the flux lines from penetrating the ferromagnetic metal and extending through to the surrounding gas. While paramagnetic metals may "attract" some flux lines of an external magnetic field, they do so to a far lesser degree than do ferromagnetic materials.

Above their Curie temperatures, nominally ferromagnetic metals behave in a manner similar to paramagnetic materials. In particular, nominally ferromagnetic metals tend to "attract" far less of the flux of an external magnetic field into themselves above their Curie temperatures than below.

Thus, without wishing to be bound by any theory of operation, it is believed that a nickel sputter target placed in the magnetic field of a magnetron sputtering device tends to "attract" the flux of the magnetic field into itself. This prevents the magnetic flux from penetrating through the target, thereby reducing the efficiency of the magnetron sputtering process.

Typically, only thin nickel targets of about 0.12 inch (3 mm) or less could be used in magnetron sputtering processes due to the ferromagnetic character of nickel. This increases the difficulty and cost of sputtering nickel, since it is necessary to replace the sputter targets at frequent intervals.

Meckel U.S. Pat. No. 4,229,678 sought to overcome this problem by heating the target material to its Curie temperature and magnetron sputtering the material while in such a state of reduced magnetization. Meckel further proposed a magnetic target plate structured to facilitate heating of the plate to its Curie temperature by the thermal energy inherent in the sputtering process. One drawback to this proposed method was the increased cost inherent in providing for the heating of the target as well as providing for the stability of the cathode assembly at increased temperatures.

The problem of magnetron sputtering nickel has been addressed in the specialty media industry by alloying the nickel with another transition metal such as vanadium. At about 12 at .% vanadium, the alloy ceases to behave ferromagnetically. Alloys of nickel with other transition metals such as chromium, molybdenum and titanium have shown a loss of ferromagnetic behavior at compositions under 15 at .%. Adopting a similar approach, Wilson U.S. Pat. No. 4,094,761 proposed alloying nickel with copper, platinum or aluminum to produce an alloy having a Curie temperature below the sputtering temperature. Unfortunately, all of these methods share the drawback that the metals alloyed with the nickel constitute impurities when the sputter target is used in a nickel silicidation process.

Therefore, there remains need in the art for a method for making a nickel sputter target which is compatible with magnetron sputtering processes.

SUMMARY OF THE INVENTION

These and other objects of the invention are met by a method for making a nickel/silicon sputter target including the step of blending molten nickel with sufficient molten silicon so that the blend may be cast to form an alloy containing no less than 4.5 wt % silicon, preferably about 4.5–50 wt % Si. The cast ingot is then shaped by rolling it to form a plate having a desired thickness and then the rolled plate is machined to form the desired target shape. The sputter target so formed is capable of use in a conventional magnetron sputter process; that is, it can be positioned near a cathode in cathodic sputtering operations, in the presence of an electric potential difference and a magnetic field so as to induce sputtering of nickel ion from the sputter target onto the substrate. However, these targets can be made thicker than conventional Ni targets so that they may be used for longer sputtering times without replacement.

Nickel-silicon alloy sputter targets in accordance with the invention have been found to exhibit sufficiently low Curie temperatures that their behavior at conventional sputtering temperatures is thought paramagnetic rather than ferromagnetic. Thus, the magnetizations of targets having thicknesses as large as 0.5 inch (1.3 cm) are sufficiently low that the targets may be used in conventional magnetron sputtering processes. Furthermore, the nickel/silicon alloy does not introduce any impurities when the target is used for nickel silicidation.

In addition, it has been found that rolling the ingot formed from casting the nickel-silicon alloy before machining the target promotes the deposition of a uniform layer of nickel silicide during the sputtering process.

Other objects and advantages of the invention will be apparent from the following description, the accompanying drawings and the appended claims.

Detailed Description of the Preferred Embodiment

In accordance with an especially preferred method for making a sputter target, nickel and silicon are blended as powders or small blocks in a crucible and melted in an induction or resistance furnace. Preferably, the blend is then cast to form an ingot containing at least about 4.5 wt % silicon. The ingot is rolled to form a plate having a desired thickness (i.e., greater than 0.12 inch (3 mm)). Finally, the plate is machined to form the target.

The nickel and silicon may be blended either in the form of powders or of small blocks. Preferably, the blending occurs in a crucible, which may be inserted into an induction or resistance furnace to melt the nickel and silicon. For example, the nickel may be introduced in the form of 1 cubic inch blocks which are melted in a crucible before blending with the silicon.

The casting, rolling and machining of the metal may be carried out by conventional means well known to those of ordinary skill in the art.

The alloy should contain sufficient nickel to form an effective nickel silicide film when sputtered. Thus, it is preferred that the alloy not exceed an upper limit, perhaps on the order of 50 wt %.

The invention will be further described by means of the following examples, which are illustrative only and not limitative of the invention as claimed.

EXAMPLE 1

Three 10 g blends of nickel and silicon powders were prepared, melted in crucibles and cast to form pure nickel, nickel-2.9 wt % silicon and nickel-14.5 wt % silicon alloy ingots. Differential thermal analyses were performed to verify these compositions. After the compositions were verified, a VSM was used to obtain the magnetization curves for each of the three compositions.

Figure 1:
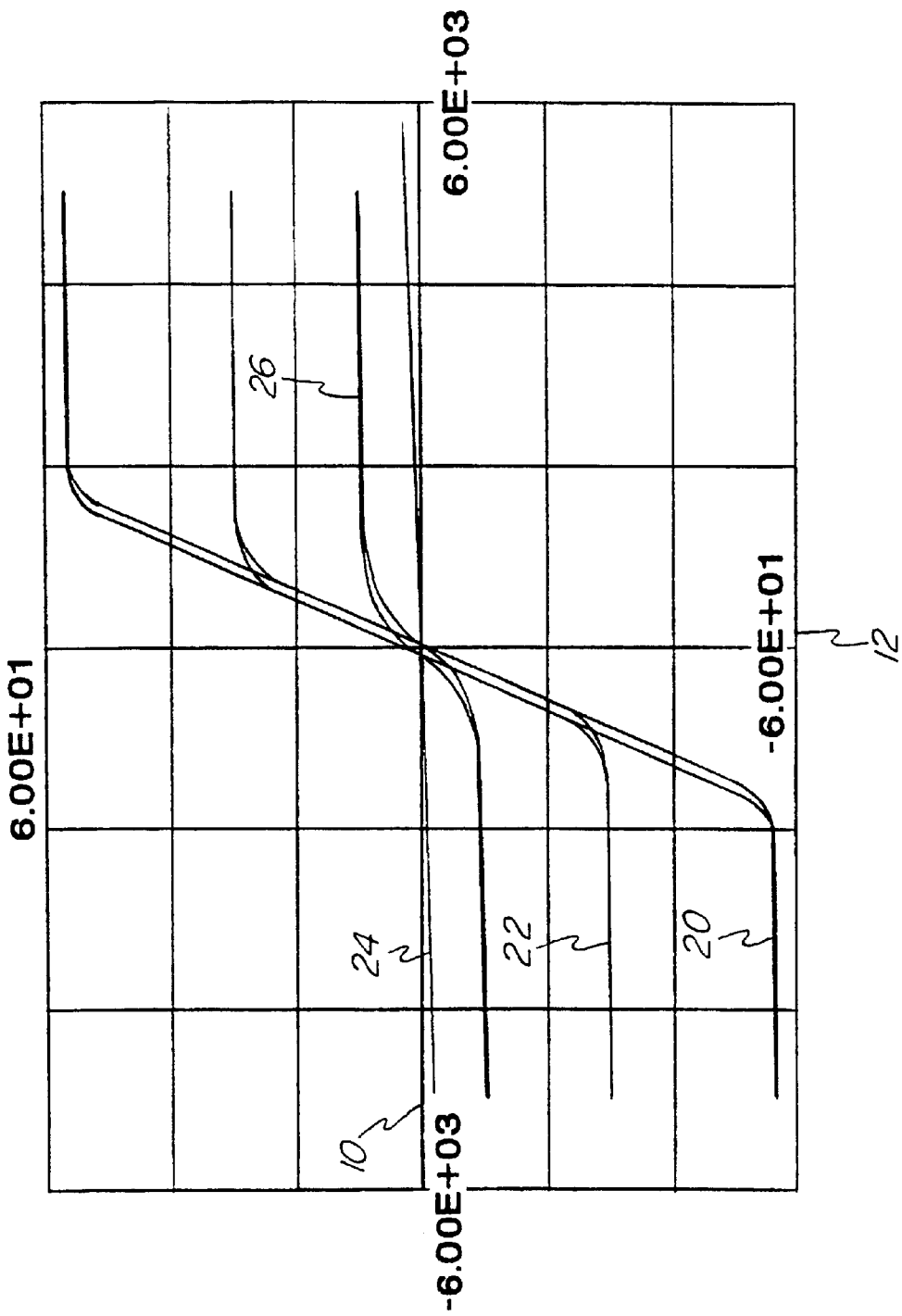
FIG. 1 is a chart showing the magnetization curves for cast nickel, nickel-2.9 wt % silicon and nickel-4.5 wt % silicon ingots.

The results are shown in FIG. 1. In the chart shown in FIG. 1, the horizontal axis 10 represents the magnetic field intensity ("H") within the ingot while the vertical axis 12 represents the magnetic flux density ("B") within the ingot. The magnetization curve 20 corresponds to the pure nickel ingot and the magnetization curve 22 corresponds to the nickel-2.9 wt % silicon alloy. While the saturation magnetic flux density of the nickel-2.9 wt % silicon alloy is about half the saturation level of the pure nickel, both of the magnetization curves 20, 22 feature significant hystersis indicative of ferromagnetic behavior.

On the other hand, the magnetization curve 24, which corresponds to the nickel-4.5 wt % silicon alloy, exhibits no significant hysteresis and appears approximately linear with a gentle slope. Thus, the magnetization curve 24 shows that the behavior of the nickel-4.5 wt % silicon alloy was paramagnetic rather than ferromagnetic. This result, along with the gentle slope of the magnetization curve 24, implies that the nickel-4.5 wt % silicon alloy is a suitable target material for a magnetron sputtering process.

EXAMPLE 2

In order to illustrate this further, a nickel-silicon alloy ingot was formed by melting and casting a blend of nickel and silicon powders. The composition of the alloy was shown by atomic absorption to be nickel-4.39 wt % silicon. Under variable source magnetometry, this alloy was found to exhibit slight hysteresis, as shown in FIG. 1 by its magnetization curve 26.

Plates of various thicknesses were prepared from pure cast nickel and from the nickel-4.39 wt % silicon alloy. The percentage of the magnetic flux which penetrated through these plates was then measured as a function of the plate thickness.

Figure 2:
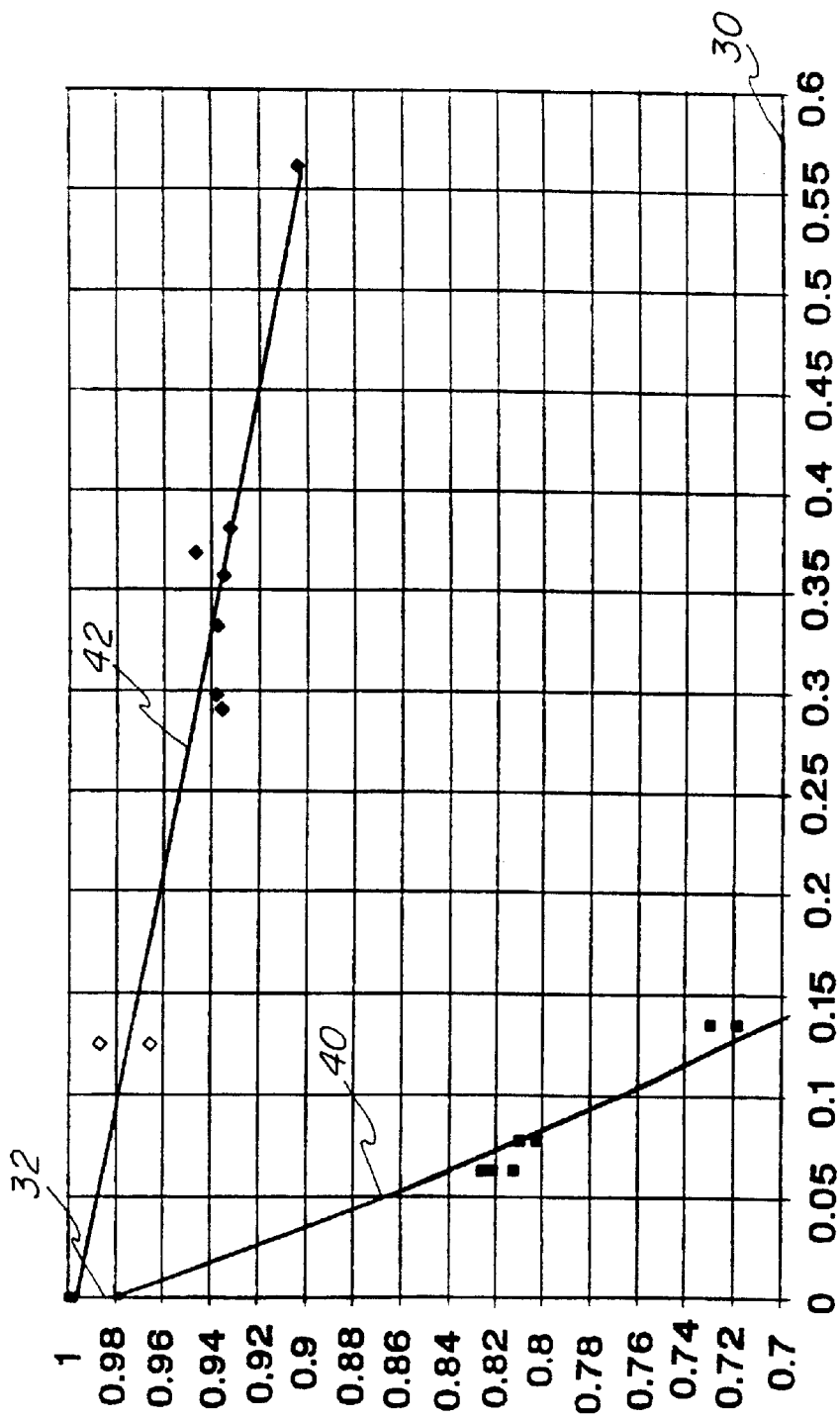
FIG. 2 is a chart showing the penetration of magnetic flux through nickel and nickel-4.39 wt % silicon plates of various thicknesses.

The results are shown in FIG. 2. The horizontal axis 30 in FIG. 2 represents plate thickness in inches while the vertical axis 32 represents the measured percentage of the original flux density which penetrated the plate. The line 40 represents the penetration of the magnetic flux through the nickel plates while the line 42 represents the penetration through the nickel-4.39 wt % silicon plates. At approximately 0.14 inch (3.5 mm) thickness, the magnetic penetration of the nickel was approximately 71%. By way of comparison, the magnetic penetration of the nickel-4.39 wt % silicon alloy at a thickness of 0.125 inch (3.2 mm) was greater than 96%.

Even at a thickness of 0.5625 inch (1.53 cm), approximately 90% of the magnetic flux penetrated through the nickel-4.39 wt % silicon alloy. While the magnetic flux penetration through the nickel-4.39 wt % silicon alloy decreased approximately linearly with increasing thickness, these results imply the suitability of sputter targets, made in accordance with the invention and having thicknesses as great as 0.5 inch (1.5 cm), for use in magnetron sputtering processes.

EXAMPLE 3

A nickel-4.5 wt % silicon ingot was cast and rolled to a thickness of 3.5 inch (8.9 cm). Slices were cut before and after the rolling process for scanning electron microscopy/optical microstructure analysis ("SEM"). An X-ray diffraction ("XRD") study also was made of the rolled sample. In addition, sputter targets having a 3 inch (7.6 cm) diameters were machined from the alloy before and after rolling.

By way of background, a metallic sputter target typically comprises a plurality of "grains" of a size visible under an optical microscope. Within each grain, the metal atoms align in a crystalline matrix.

Figure 3:
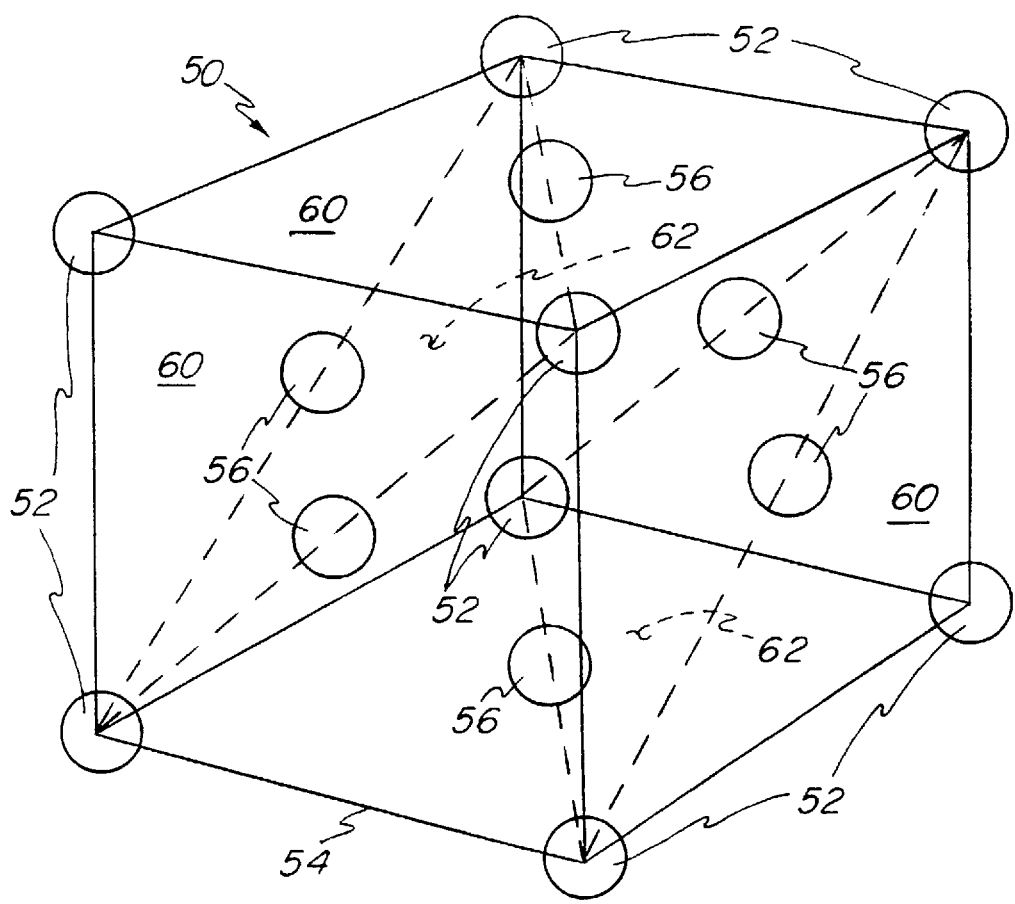
FIG. 3 is a schematic diagram illustrating the face-centered cubic structure of pure nickel metal.

Pure nickel typically crystallizes in a "face-centered cubic" matrix. Each nickel atom in the face-centered cubic matrix is typically surrounded by twelve other equally spaced nickel atoms. As shown in FIG. 3, the crystalline structure of pure nickel can be illustrated by means of a so-called "unit cell" 50 which includes a first set of nickel atoms 52 at each of the corners of an imaginary cube 54 and a second set of nickel atoms 56 centered on the faces of the imaginary cube 54.

An indication of the true size of the unit cell 50 is given by the "lattice parameter," which is the length of one of the sides of the imaginary cube 54. The lattice parameter for a unit cell of pure nickel is approximately 3.524 Å.

Two sets of planes relative to the crystalline matrix are specifically indicated on the unit cell 50 of FIG. 1: so-called "(200) planes" parallel to the sides of the imaginary cube 54 and so-called "(111) planes" which form diagonals relative to the sides of the cube 54. Examples of (200) planes are shown at 60 and examples of (111) planes are shown in phantom at 62. Since the unit cell 50 is symmetric with respect to a center point (not shown) of the imaginary cube 54, each of the (200) planes 60 is physically equivalent to each of the other (200) planes . Likewise, each of the (111) planes 62 is physically equivalent to each of the other (111) planes.

Note that the atoms 52, 56 in the unit cell 54 are more closely packed along the (111) planes 62 than along the (200) planes. The distance between these close-packed (111) planes 62 coincides with the so-called "d-spacing" of the lattice, which in the case of pure nickel is approximately 2.034 Å.

The SEM studies of the slices taken from the nickel-4.5 wt % silicon alloy before and after rolling showed that the grain sizes in the as-rolled slice were more uniform than those in the slice taken prior to rolling. It has been found that more uniform grain sizes tend to promote the deposition of more uniform film during sputtering processes.

The XRD study of the as-rolled material revealed that the material showed a preferred (200) orientation as opposed to a (111) orientation. The d-spacing of the as-rolled alloy was found to be 2.0354 Å, which corresponds closely to the d-spacing of pure nickel. This latter observation suggests a minimum of matrix deformation which might interfere with the deposition of a uniform film during sputtering.

EXAMPLE 4

The nickel-4.5 wt % silicon sputter targets prepared in Example 3 were mounted on magnetron-type cathodes for use in a DC sputtering system. A base pressure of $5.7 \times 10^{31}$ 7 Torr was achieved using a cryopump. Silicon substrates were placed below the targets and sputtered at ambient heat. The targets were sputtered in a 6 mTorr argon atmosphere at 150 W DC sputtering power. The flow of argon and the total gas pressure were manually adjusted by mass flow controllers and monitored with a capacitive manometer. After the sputtering was completed, portions of the as-deposited films were annealed under a positive field of argon gas at 400° C. for 30 min. The process was found to produce satisfactory nickel silicide films on the silicon substrates.

The foregoing examples demonstrate that the magnetizations of nickel-silicon alloy sputter targets in accordance with the invention having thicknesses as large as 0.5 inch (1.3 cm) are sufficiently low that the targets may be used in conventional magnetron sputtering processes. In addition, it has been found that rolling the ingots formed from casting the nickel-silicon alloys before machining the target promotes the formation of uniform grain sizes in the alloys, which, in turn, promotes the deposition of uniform layers of nickel silicide during the sputtering processes. Since no transition metals are alloyed with the nickel to lower its Curie temperature, no impurities are introduced when such targets are used in nickel silicidation processes.

While the method described herein and the sputter targets produced in accordance with the method constitute preferred embodiments of the invention, it is to be understood that the invention is not limited to these precise methods and sputter targets, and that changes may be made in either without departing from the scope of the invention, which is defined in the appended claims.

What is claimed is:

1. A method for preparing a sputter target comprising:

providing a mix of nickel and Si wherein Si is present in an amount by weight of about 4.39 wt %;

consolidating said mix into a blend of said nickel and Si; and forming said consolidated blend into a shape desired for said sputter target.

2. A method for making a sputter target for magnetron sputtering comprising the steps of:

a) blending of molten nickel with about 4.39 wt % silicon to form a molten blend;

b) casting said molten blend to form an ingot; and c) shaping said ingot to form the sputter target.

3. Method as recited in claim 2 wherein said step of shaping c) comprises rolling said ingot to form a plate having a thickness greater than 0.12 inch (3 mm).

4. Sputter target made in accordance with the method of claim 1.

5. Sputter target comprising a nickel/silicon alloy wherein said silicon is present in an amount of about 4.39 wt %.

6. Method of sputter depositing material from a sputter target onto a desired substrate comprising providing a target "comprising a nickel/silicon alloy wherein said silicon is present in an amount of about 4.39 wt %"and sputtering material from said target onto said desired substrate.

7. Sputter target comprising a nickel/silicon alloy wherein said Si is present in an amount of between and about 4.5 wt % to about 50 wt %, said sputter target further having a d-spacing of about 2.0354 Å.

8. The sputter target as recited in claim 7 having a thickness of approximately 0.35 inch (0.9 cm).

9. The sputter target as recited in claim 7 having a thickness of approximately 0.5 inch (1.3 cm).

10. Sputter target comprising a nickel/silicon alloy wherein said Si is present in an amount of between about 4.5 wt % to about 50 wt %, said sputter target further having a (200) orientation.

* * * * *

UNITED STATES PATENT AND TRADEMARK OFFICE
CERTIFICATE OF CORRECTION

PATENT NO. : 6,423,196 B1
DATED : July 23, 2002
INVENTOR(S) : Eugene Y. Ivanov

It is certified that error appears in the above-identified patent and that said Letters Patent is hereby corrected as shown below:

<u>Title page,</u>
Item [75], Inventor, "Ivanvov" should read -- Ivanov --.

Signed and Sealed this

Twenty-ninth Day of October, 2002

*Attest:*

JAMES E. ROGAN
*Attesting Officer*     *Director of the United States Patent and Trademark Office*